(12) United States Patent  
Olson et al.

(10) Patent No.: US 9,332,197 B2  
(45) Date of Patent: May 3, 2016

(54) INFRARED SENSOR CONTROL ARCHITECTURE

(71) Applicants: Steve Olson, Hood River, OR (US); Jordan Holt, Portland, OR (US)

(72) Inventors: Steve Olson, Hood River, OR (US); Jordan Holt, Portland, OR (US)

(*) Notice: Subject to any disclaimer, the term of this patent is extended or adjusted under 35 U.S.C. 154(b) by 401 days.

(21) Appl. No.: 13/911,764

(22) Filed: Jun. 6, 2013

(65) Prior Publication Data

US 2013/0307991 A1 Nov. 21, 2013

Related U.S. Application Data

(62) Division of application No. 12/762,113, filed on Apr. 16, 2010, now Pat. No. 8,569,684.

(60) Provisional application No. 61/259,079, filed on Nov. 6, 2009.

(51) Int. Cl.
| | |
|---|---|
| *G01D 18/00* | (2006.01) |
| *G12B 13/00* | (2006.01) |
| *H04N 5/33* | (2006.01) |
| *H01L 27/146* | (2006.01) |
| *H04N 5/365* | (2011.01) |

(52) U.S. Cl.
CPC ............ *H04N 5/33* (2013.01); *H01L 27/14649* (2013.01); *H04N 5/3655* (2013.01)

(58) Field of Classification Search
CPC ....... H04N 5/33; H04N 5/3355; H04N 5/365; H01L 27/14649
USPC ................ 250/252.1, 330, 332, 352; 348/164
See application file for complete search history.

(56) References Cited

U.S. PATENT DOCUMENTS

| | | | | |
|---|---|---|---|---|
| 2001/0045516 A1* | 11/2001 | Emanuel | ................... | B60R 1/00 250/332 |
| 2003/0183756 A1* | 10/2003 | Huniu | .................... | H04N 5/235 250/252.1 |
| 2005/0205785 A1* | 9/2005 | Hornback | ................. | G01J 5/22 250/332 |

* cited by examiner

*Primary Examiner* — Laura Gudorf  
(74) *Attorney, Agent, or Firm* — Mohr Intellectual Property Law Solutions, PC

(57) ABSTRACT

A system and method for optimizing fixed and temporal noise in an infrared imaging system. The system may use correction tables with correction factors, each correction factor indexed to a plurality of system parameters.

14 Claims, 14 Drawing Sheets

Chart 2. Multiple Bucket Fill Calibration Method Noise Levels

INFRARED SENSOR CONTROL ARCHITECTURE

CROSS REFERENCE TO RELATED APPLICATIONS

This application claims priority to copending U.S. non-provisional application Ser. No. 12/762,113, filed on Apr. 16, 2010, which is a non-provisional of U.S. Provisional Application No. 61/259,079, filed on Nov. 6, 2009, each of which is hereby incorporated by reference for all purposes.

BACKGROUND

The present disclosure relates generally to solid state imaging sensors. In particular, to methods of enhancing image quality in infrared imaging sensors. Examples of methods of enhancing image quality in imaging sensors may be found in publications WO2000052435A1 and WO2003084213A1 and in U.S. patent application Nos. 20020159101, 20020185601, 20030183756 and 20030183765.

SUMMARY

Night vision sensors are widely used in military, security, and commercial applications. The top-of-the line night vision systems available today outperform the systems available just a few years ago and provide significant advantages to our military and security forces.

Existing sensors are configured to encode a wide dynamic range of temperatures at the expense of sensitivity to small differences in temperature. This configuration exhibits good image contrast when imaging objects with temperatures spread over the wide dynamic range available. Where scenes are cluttered with a number of objects of similar temperature, the ability to detect and identify specific targets is limited.

Other problems exist for infrared sensors as well. When tuned to perform well at a specific ambient temperature, changes in temperature such as night passing to day may degrade performance and/or cause saturation in warmer daytime hours. Similarly when tuned to a warmer temperature, cooler night time temperatures may result in low contrast images.

Improved calibration and optimization techniques can increase sensitivity, contrast and dynamic range for improved infrared sensor performance and higher resolution images.

Configurations disclosed may include a method for operating an infrared imaging system with an array of pixels comprising developing correction tables for the array of pixels including correction factors with offset and gain values for each pixel. Also in the correction tables may be an index of unique values for each correction table with an integration time value, a bucket fill value and a temperature value.

The method may further include acquiring at least one calibrating scene image with a selected integration time, determining bucket fill level of the at least one calibrating scene image, determining a scene temperature of the at least one calibrating scene image, selecting a correction table by indexing the selected integration time, determined temperature and determined bucket fill level to correction table index values, applying the correction factors of the selected correction table to the array of pixels and capturing a second image.

Also disclosed may be an infrared imaging system comprising a focal plane array with a plurality of pixels, a processor operable at least in part to calculate a bucket fill level for the focal plane array, memory including a set of non-uniform correction tables each table with correction factor values including a gain and an offset and index values unique to the table including a temperature, an integration time and a bucket fill level; and means for determining the ambient temperature of a scene where a non-uniform correction table is selected from memory and the correction factor values applied to the plurality of pixels to minimize temporal and fixed noise levels.

Further disclosures may include a method for minimizing the noise equivalent temperature difference value of a focal plane array with pixels in an infrared imaging system comprising defining a group of bucket fill levels, defining a group of integration times and defining a group of temperatures. The method may include creating pixel data by creating an index by selecting one value for each of bucket fill level, integration time and temperature from each defined group, setting a substantially blackbody to the selected temperature value of the index, setting the integration time of the imaging system to the selected integration time value of the index, setting the bucket fill level of the imaging system to the selected bucket fill level value of the index, with the blackbody image focused on the focal plane array, capturing one or more data images; and saving to memory the pixel data of the data image indexed to the selected index values.

The method may further include repeating the creating step for each unique set of index values, for each pixel calculating correction factors by solving a first linear equation of pixel data of a first index and a second linear equation of pixel data of a second index, storing the calculated correction factor in memory with the first index as a correction factor index, acquiring an image of a scene at a selected integration time, determining scene temperature, calculating a bucket fill level from one or more pixels selected from the acquired image, selecting correction factors from memory by correlating correction factor index values to calculated bucket fill level, integration time and scene temperature and applying the selected correction factors to pixels of the focal plane array.

An acquired image as defined here may correlate or correspond to a set of pixel values acquired from the focal plane array of pixels and stored in memory. A feature sub-region of the acquired image may be a subset of pixels that correspond to a portion of or feature of the image. For example in an image with a human figure, a building and a background, the subset of pixels that show the human figure may be a feature sub-region separate from other pixels in the acquired image.

DETAILED DESCRIPTION

Low light imaging sensors can be implemented using various technologies. Sensors may incorporate bolometers to detect a heat related change in resistance in an element where a photon impinging on the element raises the temperature of the element.

Figures 1, 1A:
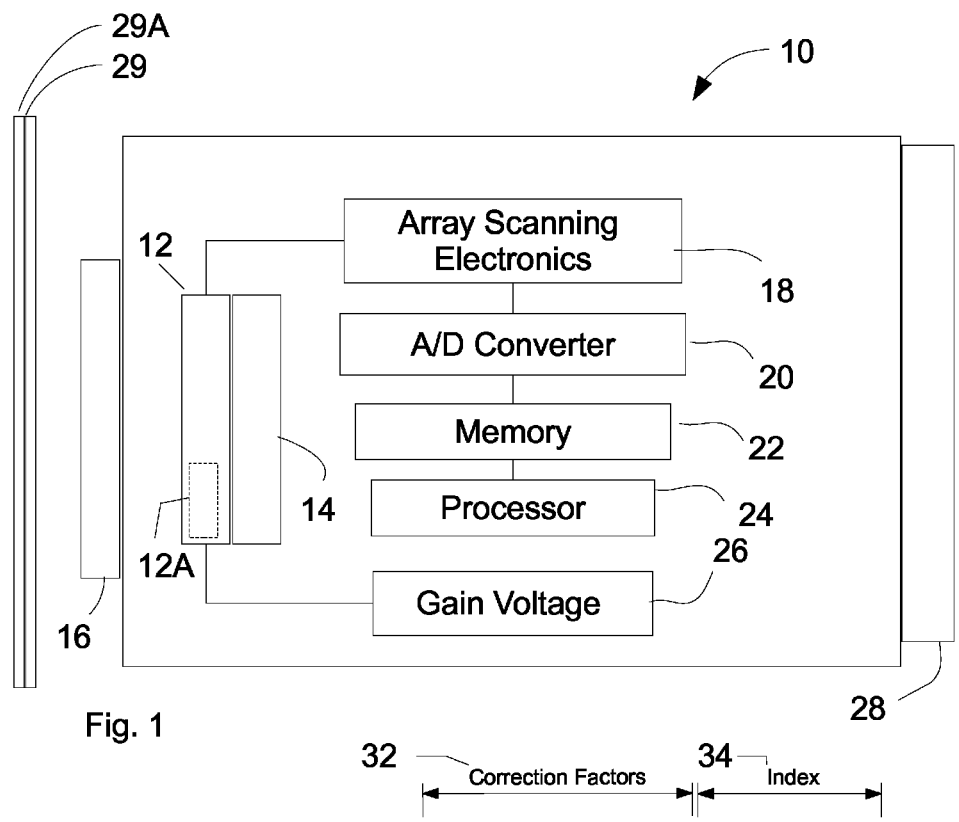
FIG. 1 is a block diagram of components and functions in an infrared imaging system including a focal plane array, scanning electronics, analog to digital converters and a processor.
FIG. 1A is a block diagram showing a correction table with correction factors and index that may be stored in memory.

A more common type of detector is a solid state element that accumulates a charge from absorbed photons. FIG. 1 is a block diagram representation of an infrared imaging system 10 including a focal plane array or FPA 12 with pixels 12A shown as a dotted line box, an FPA cooler 14, optical focusing system 16, array scanning electronics 18, analog to digital converter 20, memory or registers 22, processor 24, gain voltage source 26 and display 28. Infrared imaging system 10 may include or may be used in association with a substantially blackbody or calibration paddle 29 connected to a temperature control 29A.

FIG. 1A shows memory 22 of FIG. 1 with a non-uniform correction (NUC) or correction table 30 that may include correction factors or correction factor set 32 for focal plane array 12 and/or pixels 12A as well as index or index values 34.

Focal plane array 12 of discrete pixels 12A may be exposed to a scene with features at different temperatures. The scene may have limited ambient visible light and the primary source of photons may be in an infrared range from the ambient heat of various features in the scene. In a night scene the features with the most ambient heat may be mammals, buildings and objects with residual heat absorbed from sunlight. There may be a wide range of temperatures due to shading, internal heating, etc.

The infrared light from the scene may be focused by optics 16 or other physical arrangement to create an image at FPA 12. Each pixel 12A may charge at a rate related to the number of photons hitting it. Each pixel will charge to a value between zero and some maximum voltage value. Light is collected over a set period called an integration time and at the end of the period each pixel element is polled and its charge level is converted to a digital value at analog to digital converter 20 and stored in memory 22. These digital values may then be used to create a recorded image which may be presented on display 28.

Image saturation occurs when by the end of the integration time many pixels reach their maximum charge so that scene details are not captured. A gain factor can be applied to pixels 12A by gain voltage 26 to act as a multiplier for the rate of charge with each impinging photon. The gain can be set so that a very hot scene with many impinging photons doesn't charge a majority of pixels to their maximum value in a very short period.

At the same time, a higher charge per pixel or bucket fill at a level below saturation level gives a higher signal to noise ratio. Bucket fill relates to the percentage fill of the digital registers read by the analog-to-digital converter. This may correspond to the average charge of all pixels in the focal plane array as a proportion of maximum charge for the pixels.

Two measures of acquired image quality are fixed pattern noise and temporal noise. Fixed pattern noise is induced by the inherent response variations between pixels, for example the variation in rate of charge of a pixel for an identical number of photons. Temporal noise comes from all time-varying noise sources such as readout electronics and statistics of underlying Poisson processes. Minimizing the total noise from these sources in relation to signal improves image quality.

Three parameters that affect the signal to noise ratio are pixel offset, pixel gain and integration time. Setting these parameters to optimum values for the current conditions can greatly improve image quality. This is typically done by calibrating some settings at the factory that are stored in non-uniform correction (NUC) table 30 in memory 22. These values can be referenced in the field and applied to pixels 12A of focal plane array 12. Other parameters are set in the field using a temperature reference to develop additional pixel correction tables 30 based on current conditions. These corrections adjust pixel gain and offset to optimize the signal to noise ratio for current conditions.

Offset values for the NUC table 30 may be determined in the field with a scene of one uniform temperature, usually a paddle configured as a substantially blackbody 29 and held at a fixed temperature across the entire face. In practice blackbody 29 may be as simple as a piece of foam or metal at room temperature. An image of blackbody 29 is focused on focal plane array 12. Pixel response may be measured with a fixed integration time at each temperature and correction factor 32 may be recorded in NUC table 30.

Figure 2:
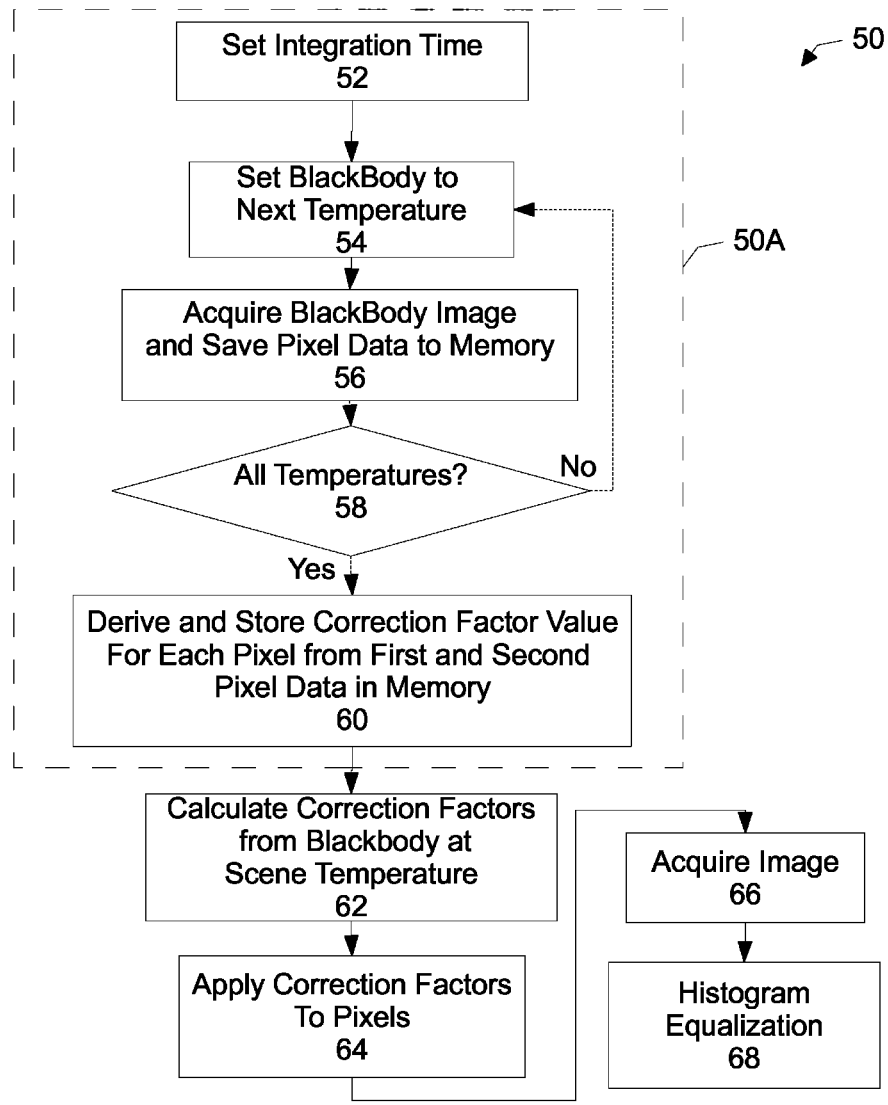
FIG. 2 is a flow chart showing a standard method of calibration for an imaging system.

FIG. 2 is a flow chart of steps used in a standard calibration 50 of an infrared imaging system 10. In step 52 the integration time is set. In step 54 the calibration of the blackbody is set to temperature. In step 56 one or more images is acquired for blackbody 29 and pixel data is saved in memory 22. In step 58, if all values of temperature have been used, control goes to step 60, else control returns to step 54 and a next temperature is set. In step 60 gain correction factor values for each pixel are derived based on at least two sets of pixel data and stored in correction table 30 with an associated index 34. These steps are grouped by a dotted line box 50A and may be performed at the factory before delivery of imaging system 10. In step 62 an offset correction factor may be determined by acquiring one or more images of blackbody 29 at a current scene temperature. In step 64 correction factors are applied to pixels 12A. In step 66 an image is acquired.

The steps of FIG. 2 may be executed in a different order where it achieves similar results. For example, deriving correction factors of step 60 may be done at least in part between the iterative steps of setting temperature for blackbody 29.

This standard calibration is commonly-called a "two-point" or "n-point" correction method. Two uniform sources of known intensity, such as blackbody 29 at two (or more) different temperatures, are sequentially imaged as in step 54. Each pixel response can be approximated as a measured variable y(t) and a real-world variable x(t) can be written as:

$$y(t) = a * x(t) + b$$

with a and b being the pixel's multiplicative gain and additive offset, respectively. By focusing the image of blackbody 29 on focal plane array 12 at two temperatures and recording the pixel values for each image, a linear system is created with two or more equations and two unknowns at each pixel. The gain and offset values or correction factor 32 for each pixel can be easily computed and stored as part of a correction table 30. These correction factor derivation methods are common and well known to those skilled in the art.

The histogram equalization of step 64 is a mathematical transform typically used for images with low contrast, either with background and foreground that are low intensity or both high intensity. In a low intensity image the number of pixel level occurrences on a grayscale are at a low end. Equalization resets pixel values so that the occurrences are spread more evenly across the grayscale. A high intensity image has pixel level occurrences at the high end of the grayscale. Equalization similarly resets pixel values to spread them more evenly across the grayscale while maintaining image characteristics.

Figure 12:
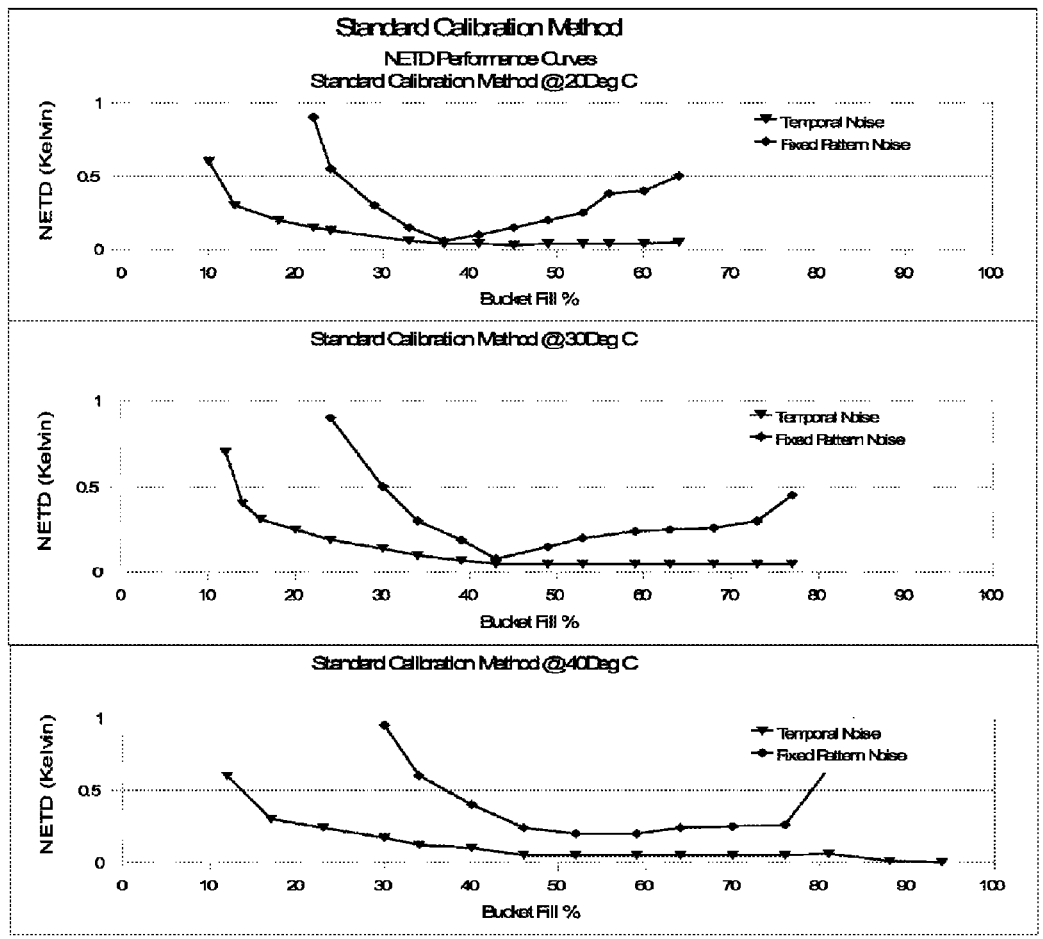
FIG. 12 is a chart depicting standard calibration noise levels.

Noise Equivalent Temperature Difference (NETD) is a standard measure of performance for sensors as may be used in an infrared camera. Fixed pattern noise is calculated by computing the average of each NUC-corrected pixel using collected images of a blackbody source at a particular temperature and sensor integration time. This set of averaged pixels is known as the fixed pattern noise (FPN) image. Fixed pattern noise—the deviation from the mean over all pixels—is then estimated as the standard deviation of all pixel samples. Dividing this value by the system gain at this integration time yields the corresponding NETD and is expressed in degrees Kelvin. Chart 1 shown in FIG. 12 is an example of noise in an imaging system calibrated by standard calibration method 50.

Standard calibration method 50 may result in low fixed pattern noise for the one integration time at which the offset correction was calculated and at scene temperatures that are close to the temperature of the paddle 29. But if the integration time is held fixed, temporal noise will be high for scenes with low bucket fill or saturation may occur in high temperature scenes. Varying the integration time without re-calculating the offset correction results in high fixed pattern noise. Also scene temperatures far from the "paddle" temperature show increased fixed pattern noise.

As an example, a flight crew may prepare at dusk for a night time reconnaissance mission. They execute a "paddle" calibration of the camera before take-off in the hangar at 1 OC with the integration time set to 5 ms to prevent image saturation. Initial imagery looks good, but as their northern latitude location cools, noise relative to signal grows. By the time the ground reaches −40 C, the noise swamps most of the signal. The signal could be increased by increasing the integration time, but changing the integration time from the one at which the "paddle" calibration was done will result further increase fixed pattern noise.

An improved system would automatically adjust internal camera gain, offset and integration time to continuously optimize output image signal to noise while maintaining dynamic range sufficient to prevent saturation. The system should operate without operator intervention and without calibration paddles. The system should have a response time capable of handling both slow and fast changes in background temperatures to accommodate both gradual ambient temperature shifts and rapid scene changes. It should also store or automatically compute correction factors 32 to match the current system operating parameters. The system should maintain a high bucket fill, which optimizes signal to noise over a wide range of scene temperatures.

Multiple Bucket Fill Calibration Method

Figure 3:
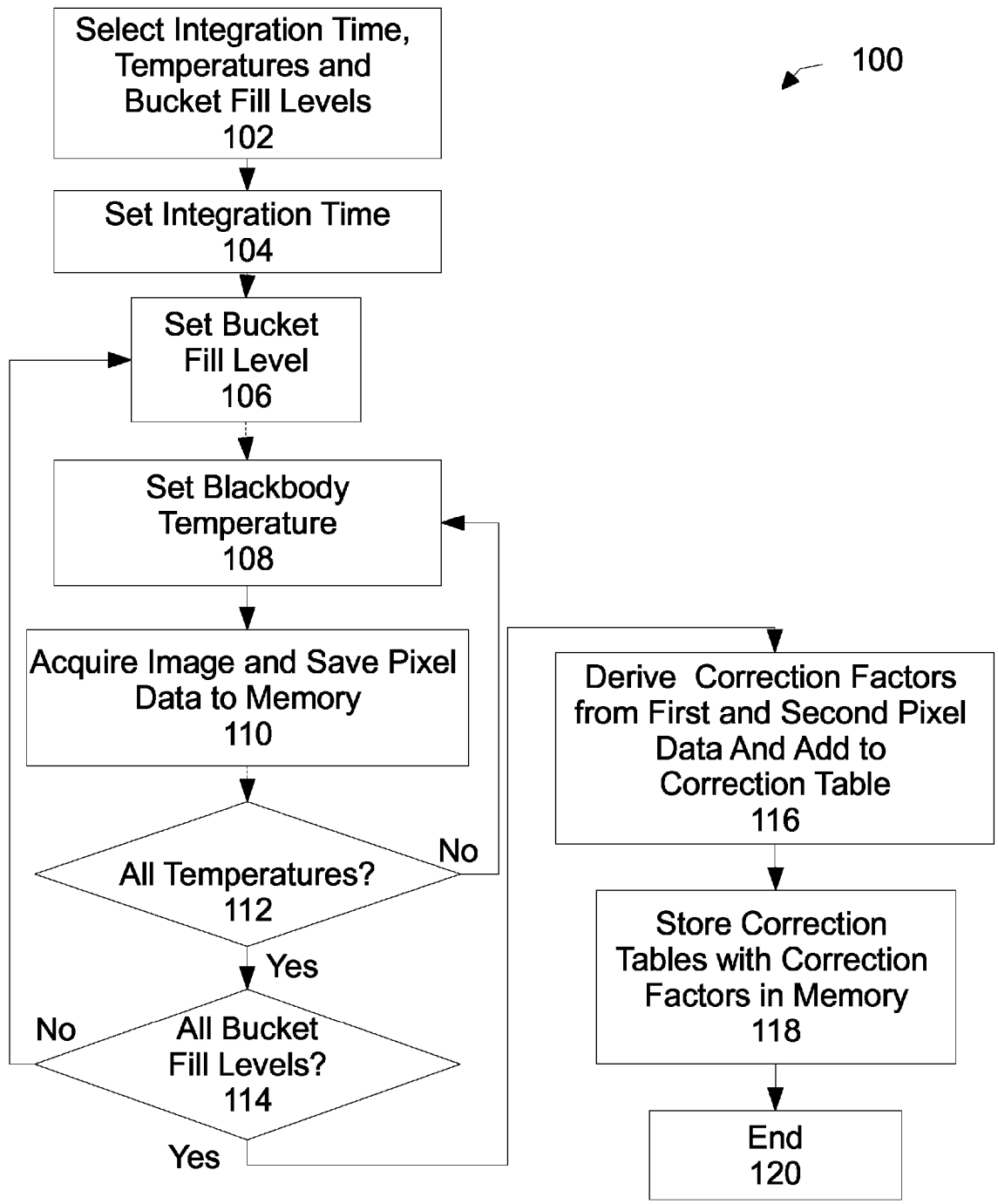
FIG. 3 is a flow chart showing a multiple bucket fill method of calibration for an imaging system.

FIG. 3 is a flow chart of a multiple bucket fill calibration method 100 using correction factors 32 associated with index 34. In step 102 an integration time, a set of temperatures and a set of bucket fill levels are selected as index values 34. Using a selected index 34 with a unique set of values and at step 104 the integration time of the selected index 34 is configured. In step 106 the bucket fill level is set and blackbody 29 is configured to the temperature of selected index 34 in step 108. In step 110 pixel data of one or more images of blackbody 29 is acquired and added to memory 22.

At step 112 if all fill levels from the set of bucket fill levels have been sampled, control goes to step 114. If all fill levels have not been sampled, control returns to step 108 and a new fill level is set until all fill levels have been completed. When all fill levels have been sampled control then goes to step 116 where correction factors are derived from first and second pixel data and correction factors 32 are added to correction table 30 with index values 34. At step 118 calibration ends. Each bucket fill level used and each temperature used are new unique indexes 34. This method produces correction factors 32 and correction tables 30 at multiple parameter set points. First and second pixel data for deriving correction factors is typically two sets of data with index values 34 adjacent or proximate in value.

Figure 13:
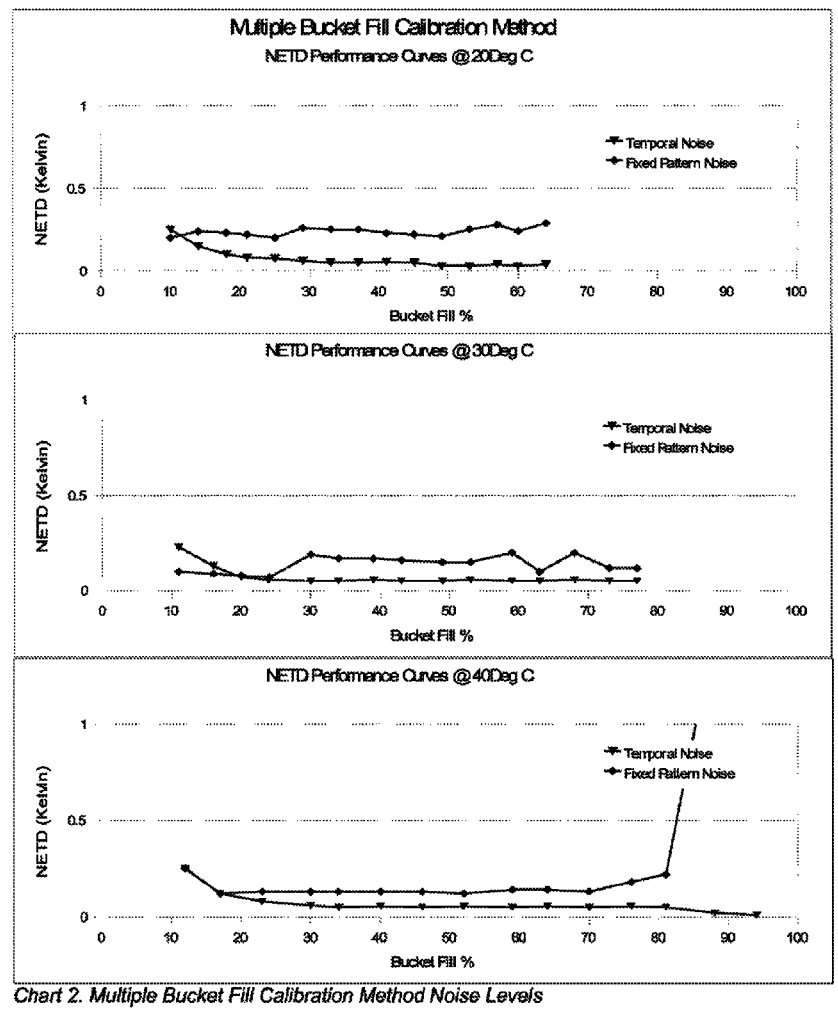
FIG. 13 is a chart depicting multiple bucket fill calibration noise levels.

Chart 2 shown in FIG. 13 is an example of noise levels for imaging system 10 after multiple bucket fill calibration 100. In this example 17 bucket fill levels are used and three temperatures. As shown in Chart 2 in FIG. 13, multiple bucket fill method 100 offers a substantial improvement over standard calibration method 50. Levels of temporal and fixed pattern noise are noticeably lower than the levels resulting from standard calibration method 50. This illustrates the observation that although overall detector performance remains approximately linear, gains and offset changes need to be adjusted at different fill levels.

Figure 4:
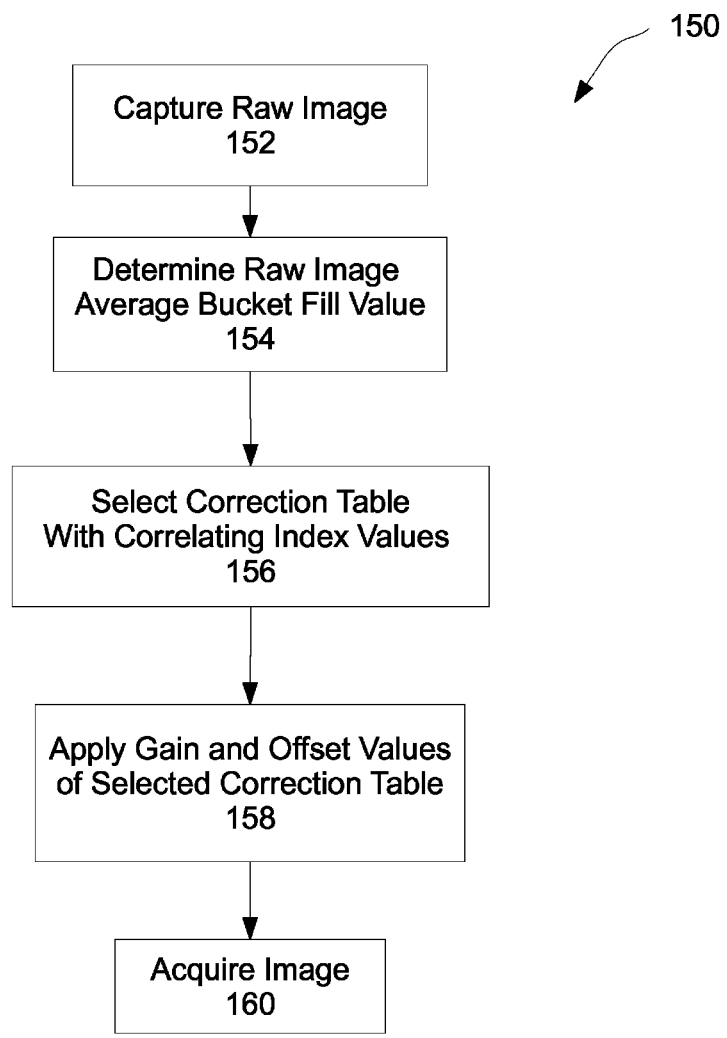
FIG. 4 is a flow chart showing a method for applying correction tables of a multiple bucket fill calibration to an imaging system.

FIG. 4 is a flow chart illustrating an implementation method 150 for applying correction factors 32 during operation of imaging system 10. In step 152 a scene image is acquired at focal plane array 12. At step 154 the average bucket fill of the scene image is calculated from pixels of the acquired image of step 152. Correction table 30 with index values correlating to the scene image is selected at step 156. Gain and offset values from the selected table are applied to pixels 12A of imaging system 10 at step 158. A second calibrated scene image is acquired at step 160.

In an alternate configuration, step 152 may be repeated one or more times and the average bucket fill may be determined from the multiple acquired scene images. In another alternate configuration a subset of the pixels of the acquired image of step 152 may be used to calculate the average bucket fill in step 154. The subset of pixels from the acquired image of step 152 may be a region of interest such as a feature in the image.

[36] In yet another alternate configuration step 152 may be repeated to acquire multiple images and a subset of pixels from each of the multiple acquired scene images of step 152 may be used in calculating the average bucket fill of step 154. The subset of pixels may be as small as one pixel and the average bucket fill may be determined by selecting a correlated pixel from each of several scenes. The pixel selected may be the same pixel in focal plane array 12 for each image or the pixel may be a specific pixel related to the scene such as a corner of a building which in a moving scene may correlate to different pixels of focal plane array 12 in successive images.

The subset of pixels or the one or more pixels of the acquired image used to determine bucket fill may be selected to optimize the configuration of imaging system 10 to show a specific feature. For example a feature sub-region of the acquired image may show a building. One or more pixels of the feature sub-region may be selected for determining a bucket fill level in order to optimize the acquisition of additional images of the building.

Multiple Integration Time and Bucket Fill (MIB) Calibration Method

Figure 5:
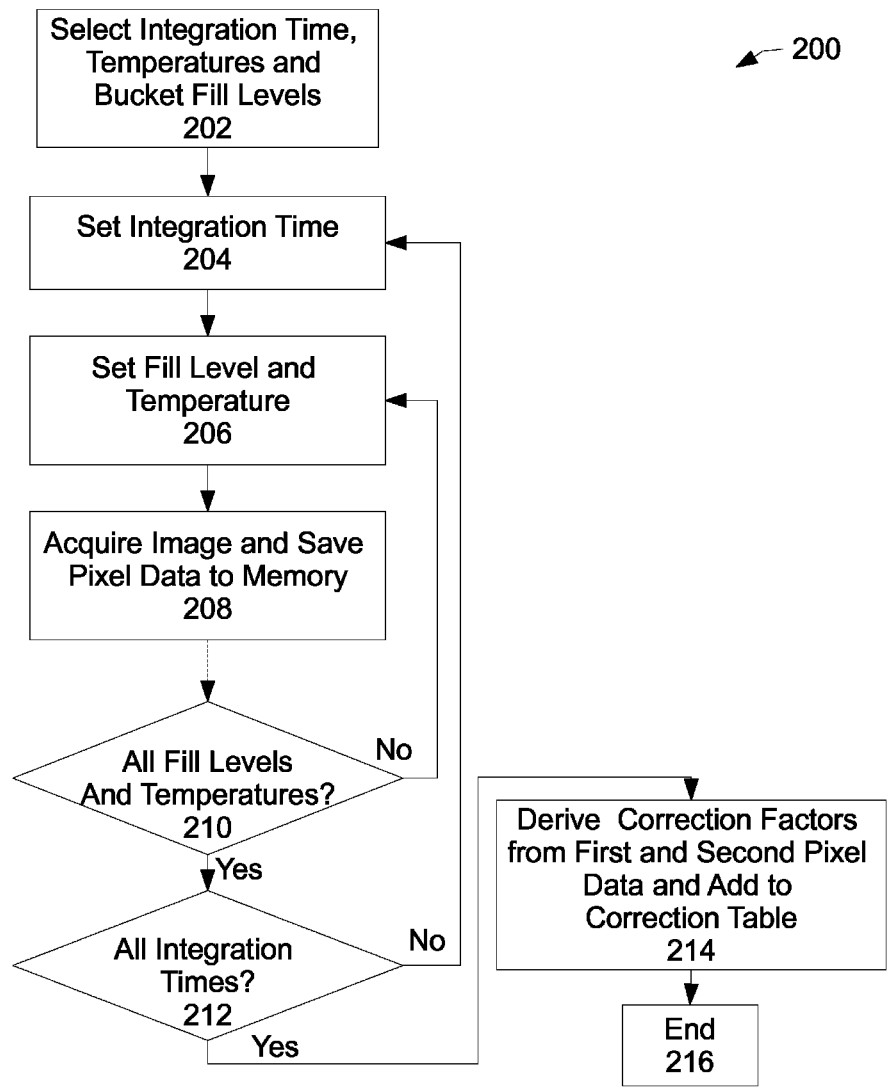
FIG. 5 is a flow chart showing a dynamic multiple integration/bucket fill method of calibration for an image system.

FIG. 5 is a flow chart similar to multiple bucket fill calibration method 100 of FIG. 4 but with an additional parameter of integration time to create a multiple integration time and bucket fill (MIB) calibration method 200. In step 202 an integration time, a set of temperatures and a set of bucket fill levels are selected as values for index 34. In step 204 an integration time is set. In step 206 the temperature of a blackbody is set and a bucket fill level is set. In step 208 one or more blackbody images is acquired and pixel data is stored in memory 22. At step 210 and 212 if all values of bucket fill, integration times and temperatures have not been sampled, control returns to step 204 and step 206 to set new integration times and bucket fill levels until all values have been tested. Each iteration corresponds to a new index 34 with unique values. Control then goes to step 214 where correction factors are derived from first and second pixel data. The correction factors 32 and index values are stored in memory 22 as correction tables 30. MIB calibration method 200 ends at 214. This may produce correction factors 32 at multiple parameter set points including a range of integration times.

Figure 14:
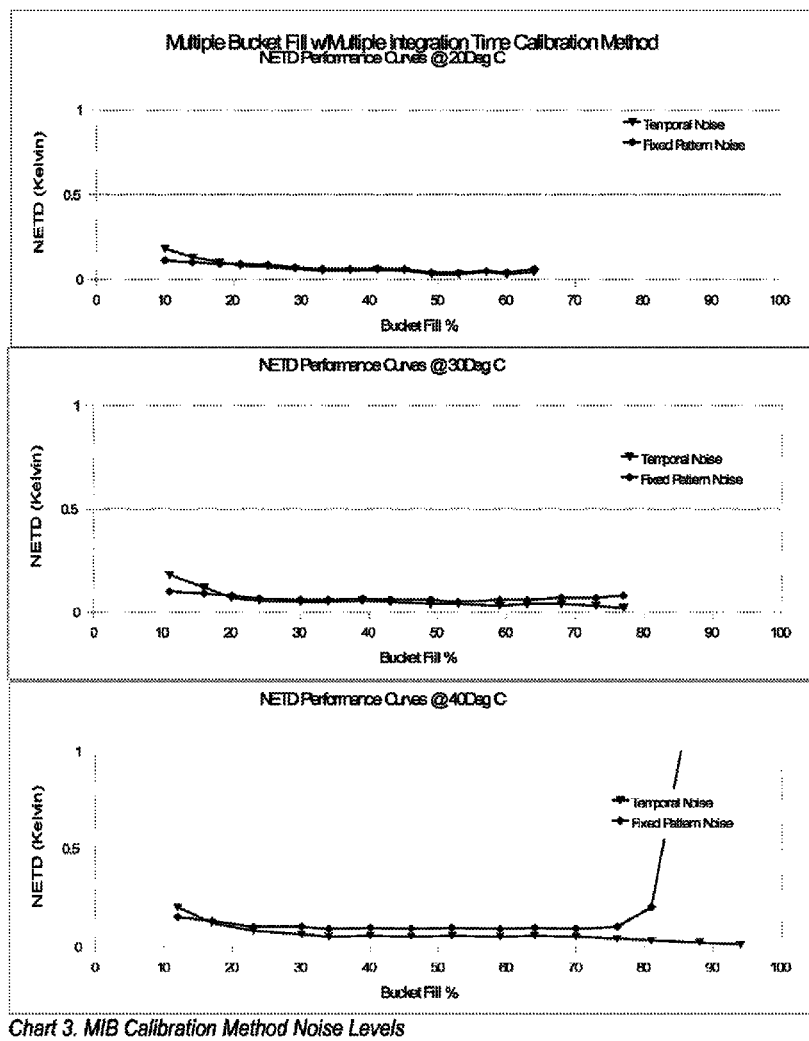
FIG. 14 is a chart depicting MIB calibration method noise levels.

Chart 3 shown in FIG. 14 is an example of noise levels for imaging system 10 after MIB calibration 200. Performance is significantly improved over both standard calibration method 50 and the multiple bucket fill method 200. Fixed pattern noise is held to a low, nearly constant level well below the level of temporal noise.

While these examples are for a set range of relatively high temperatures, similar results may be duplicated at lower temperatures. Correction tables 30 developed in the method of FIG. 5 may be implemented and applied in a similar method as described in FIG. 4.

Figure 6:
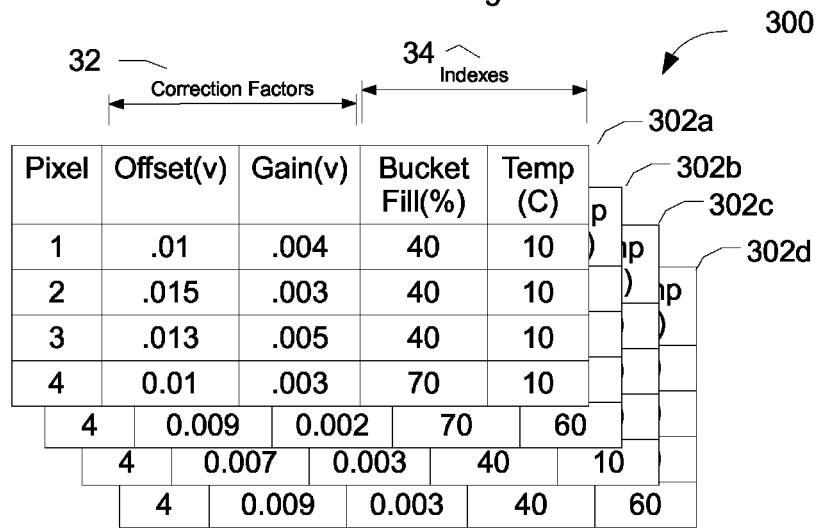
FIG. 6 is a representation of a set of correction tables with two values of an index.
Figure 7:
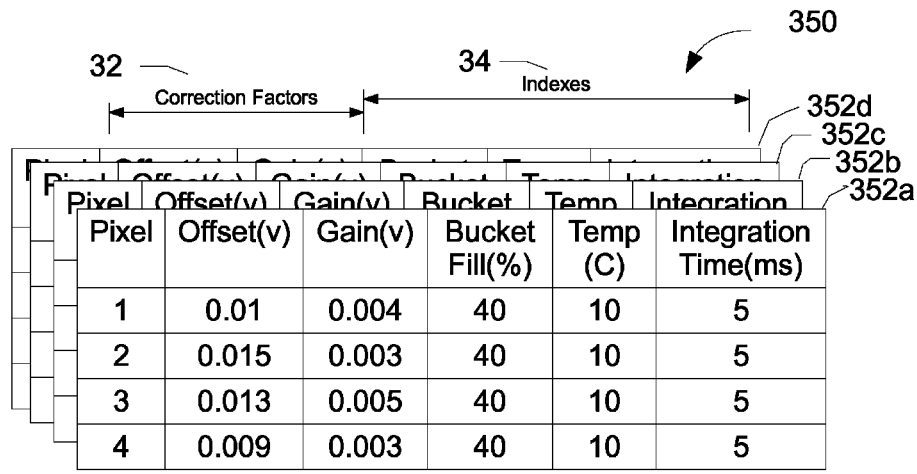
FIG. 7 is a representation of a subset of correction tables with three index parameters.

FIGS. 6 and 7 are examples of NUC or correction tables 30. FIG. 6 shows a set of NUC or correction tables 30 for four pixels of a focal plane array 12. This is obviously greatly simplified. A focal plane array can have pixels numbering in the millions.

Here there are two correction factors 32 and two parameters of indexes 34. Each correction table has a unique set of index values. The index values for the correction table may be part of index 34. The index parameters here are bucket fill and temperature. The index values of the first row are 70 and 10 in correction table 302a. The index values in the second row are 70 and 60 in correction table 302b, etc. This has resulted in four correction tables 30.

FIG. 7 is a subset of four correction tables 352a, b, c and d similar to those in FIG. 6. Here a third index parameter of integration time is included as may be the case with MIB calibration method 200. The four correction tables shown in the example are for one integration time of a set of integration times. If four set points or values are used for the integration time parameter, twelve correction tables will be produced. Index 34 for table 352a has values of 40, 10 and 5.

The use of tables in these examples is for the purposes of example only. Values may be stored in memory as a series of pixel locations on the focal plane array with a list of associated values. Tables may be a mnemonic for understanding how the values are used.

The set of Index values 34 may be unique and each table will have it's own unique set of index values as well as correction factors 32 for all pixels 12A in focal plane array 12. An image acquired by imaging system 10 may have a set of characteristic values that may include one or more from the value set of bucket fill value, scene temperature and integration time. Applying the correction factors 32 of correction tables 30 may include correlating or indexing the characteristic values of the acquired image to index values 34 of correction table 30. Indexing or correlating may include matching the temperature values, the integration times and/or the bucket fill values between the image characteristic values and the index values 34 to identify a closest agreement.

The parameters and values used here for characteristic values are examples. Other sets of parameters and values which perform a similar function tying correction factors 32 to pixels may be used and still fall within the scope of this disclosure.

Applying the correction factors 32 to pixels of the focal plane array may be done by any of a number of methods which are well known to persons with ordinary skill in the art. The correction factors 32 may be applied so that it affects the actual function of the individual pixels in acquiring charge. Correction factors 32 may be applied to the digitized values of the pixels stored in memory 22. Any method of applying correction factors 32 from correction tables 30 that reduces the noise level in an acquired image will fall within the scope of this disclosure.

Dynamic MIB Calibration Method

A disadvantage of MIB calibration method 200 is that it creates exponentially more correction tables 30 and requires more memory and lookup time. Imaging system 10 may be configured to operate within a limited bucket fill range using a target bucket fill 36.

Figure 8:
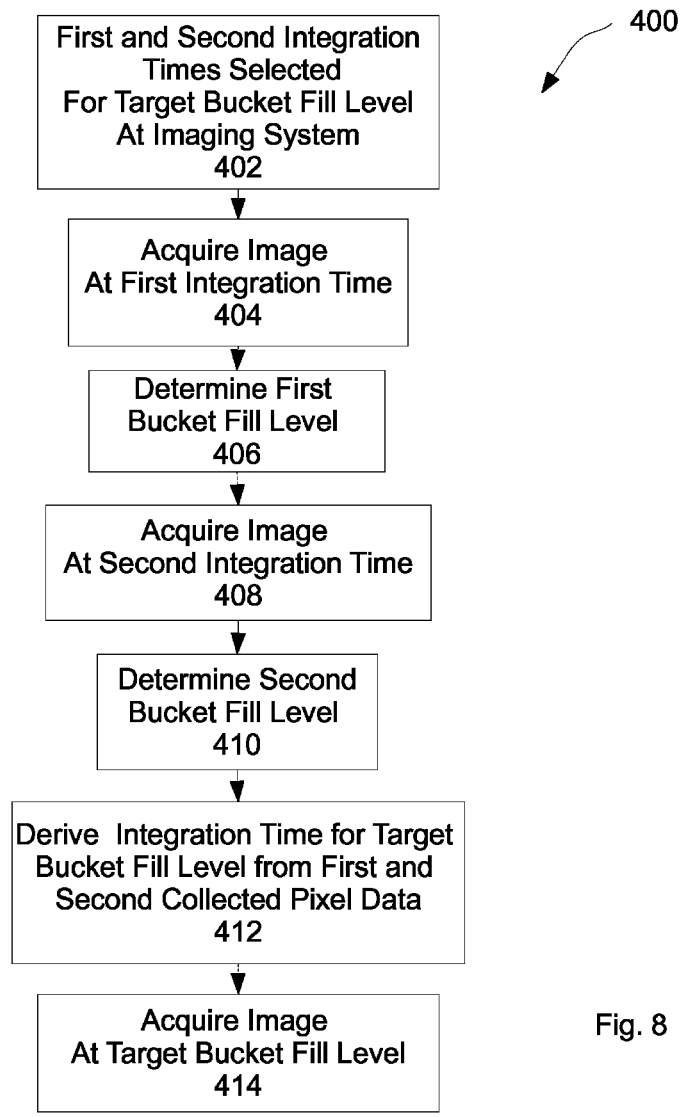
FIG. 8 is a flow chart showing a method of calculating parameters for a target bucket fill level.

FIG. 8 is a flow chart describing a method 400 for selecting an integration time that produces target bucket fill 36 and uses a limited number of correction tables 30. In step 402 first and second integration times and a target bucket fill 36 are selected. In step 404 a first image is captured at the first integration time. In step 406 a second image is captured of the same scene. In step 408 the scene integration time for bucket fill level 36 can be derived as a two equation linear system with integration time and bucket fill factors in a similar manner as described above for deriving correction factors 32. In step 410 the integration time for imaging system 10 is set.

This method is often sufficient because the non-uniformity and temporal noise curves are smooth and do not vary over large magnitudes. Also, processing the corrected image with histogram equalization or similar algorithm results in an output image that maintains a fairly consistent intensity even as the integration time changes to a level short of saturation. Only the noise level will change in a fairly static scene.

Target bucket fill 36 may have an assigned value, but may be implemented as a range of values. Target bucket fill 36 may have a tolerance resulting in a range of allowed bucket fill values around target bucket fill 36. This may be a function of limitations of imaging system 10 or may be a function of limitations of the calculation accuracy or other factors.

Method 400 may require a substantially static scene. In a moving scene, the two sample technique may result in an unstable solution that bounces between too bright and too dark. As most systems have a limited range of integration times, such as 1 to 20 milliseconds in 1 millisecond steps, it's feasible to iteratively set an integration time, measure the bucket fill of a captured image and adjust the integration time appropriately until the desired bucket fill level is achieved. This may be useful for non-static scenes.

Figure 9:
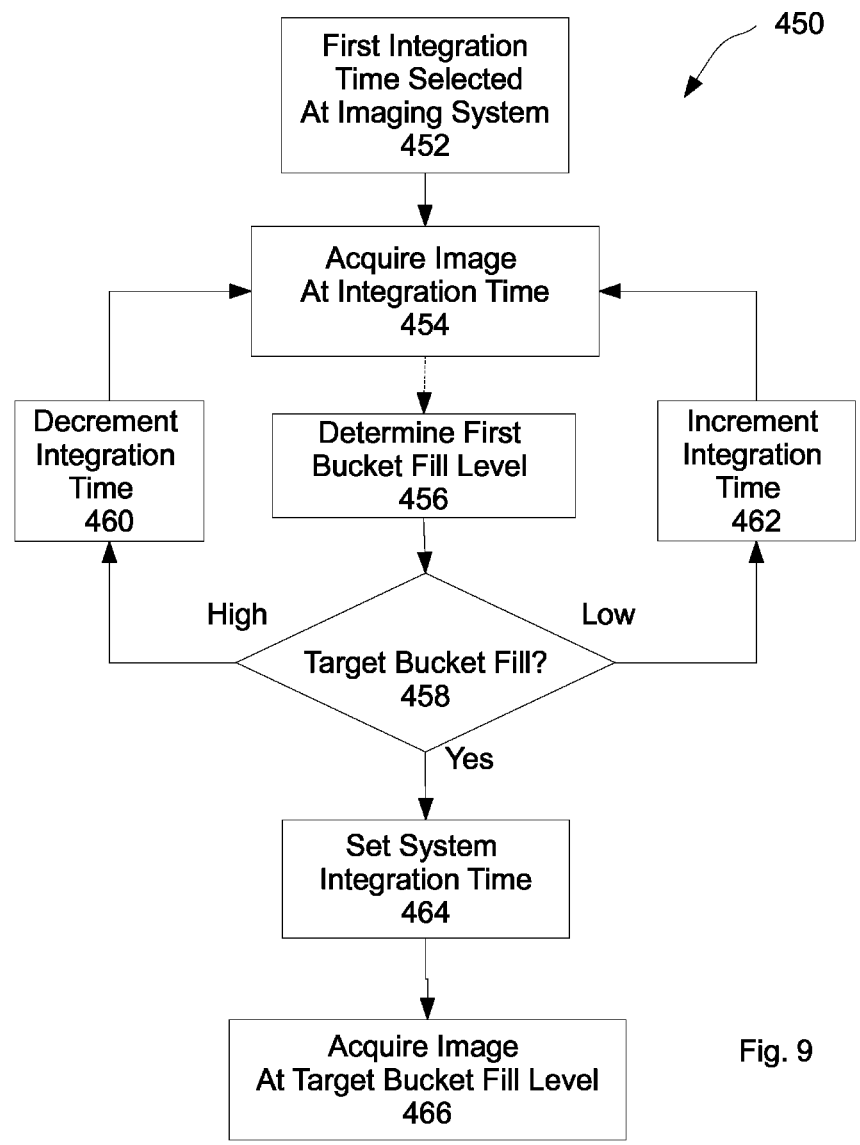
FIG. 9 is a flow chart showing an iterative method of achieving a target bucket fill level.

FIG. 9 is a flow chart illustrating a variation of method 400 with iterative steps 450 for configuring imaging system 10 to target bucket fill 36. In step 452 a first integration time is set. This may initially be a default setting. At step 454 an image is acquired. At step 456 the bucket fill level for the acquired image is determined. At step 458 the determined bucket fill level is compared to target bucket fill level 36. If the determined bucket fill level is high, integration time may be decremented at step 460. If in step 458 the determined bucket fill level is low, the integration time may be incremented at step 462. In both cases, control may return to step 454 where a new image is acquired. If at step 458 the acquired image is at target bucket fill level 36 control may pass to step 464 and system integration time may be set to the current integration time. At step 466 an image may be acquired at the system integration time and operation of imaging system 10 continues.

Figure 10:
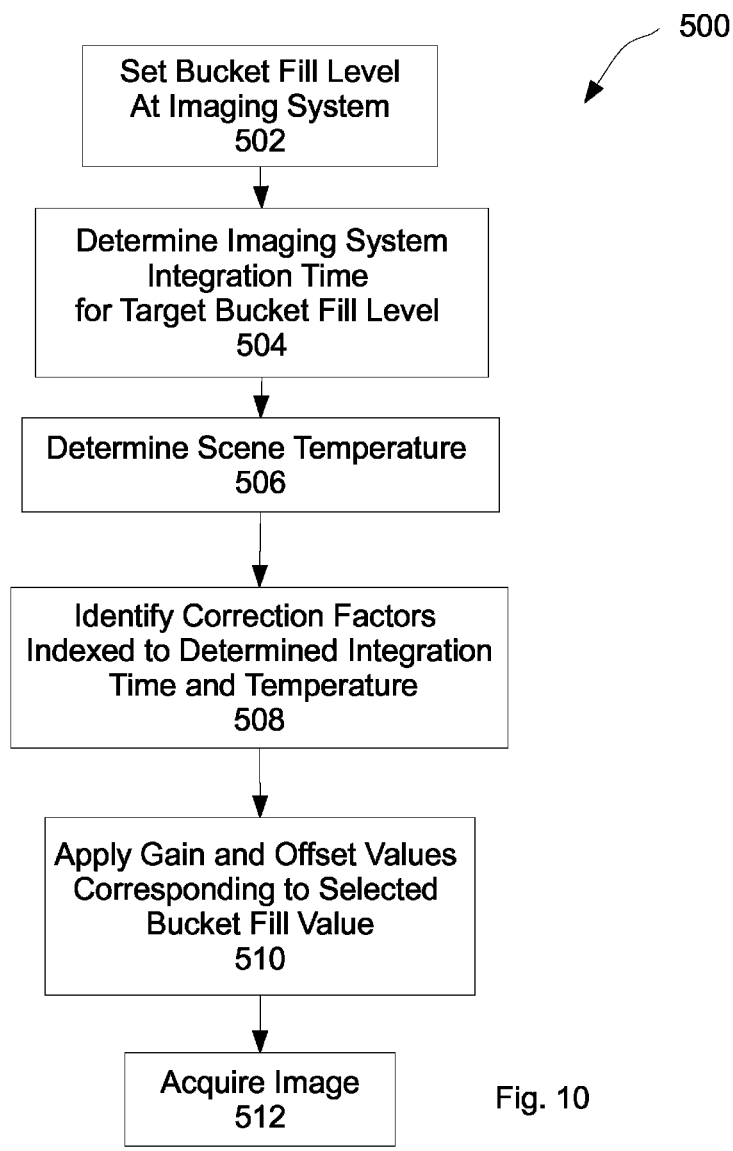
FIG. 10 is a flow chart showing a method if implementing a calibration method with a limited number of correction tables.
Figure 11:
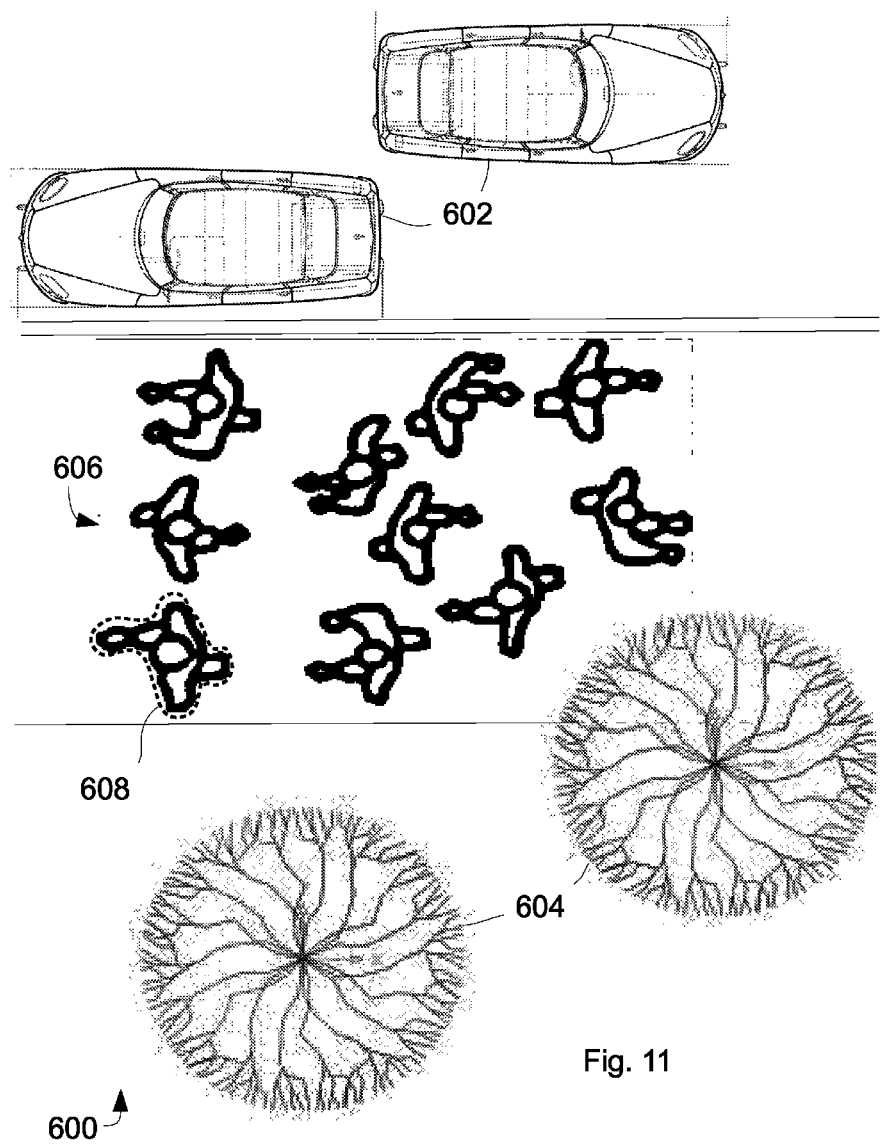
FIG. 11 is an example of an image acquired by the imaging system with a feature sub-region.

FIG. 10 is a flow chart of a dynamic method 500 of implementing the MIB calibration method 200 with imaging system 10 configured to target bucket fill 36. In step 502 target bucket fill level 36 is assigned to imaging system 10. In step 504 a set of correction tables 30 are developed for imaging system 10 that are indexed to a range of integration times, a range of temperatures and the assigned target bucket fill level 36. Imaging system 10 identifies an appropriate integration time to attain the assigned bucket fill level in step 506. In step 508 a scene temperature is measured. In step 500 a correction table is selected by matching the imaging system integration time and measured scene temperature to the indexes of the correction table. In step 512 the correction factors 32 are applied to the pixels 12A of focal plane array 12.

By operating at a target bucket fill 36 fewer correction factors 32 need to be stored by the system, memory requirements are lower and lookup times can be greatly reduced. Also a bucket fill range can be selected that minimizes the combined noise and optimizes image quality. A noise comparison of the Standard Method and our dynamic MIB calibration method 500 is shown in Chart 4 in FIG. 15. They axis scale of chart 4 is changed from the y axis scales of previous charts.

Figure 15:
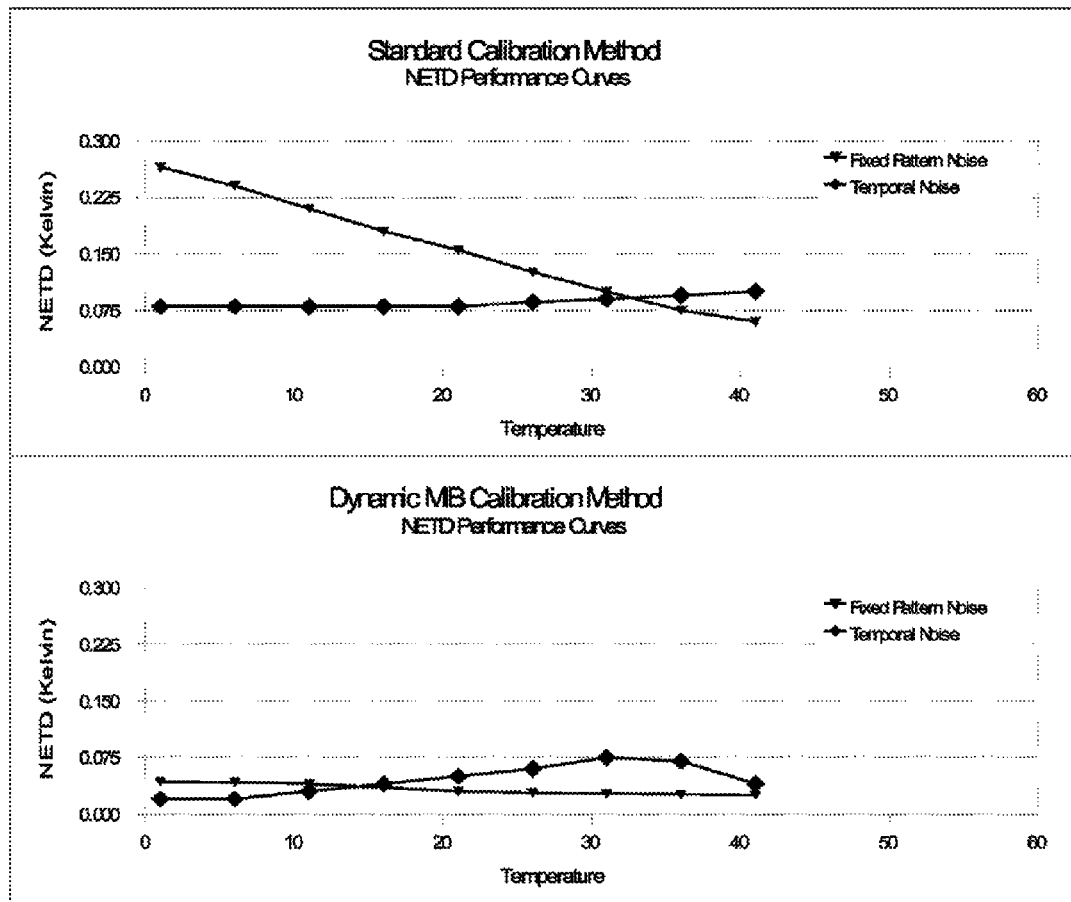
FIG. 15 is a chart depicting standard calibration and MIB calibration noise at temperature.

In chart 4 in FIG. 15 the dynamic MIB calibration method is shown to maintain a much lower noise level across all temperatures in this example. This method also does not require a blackbody paddle 29 and the associated temperature maintenance equipment required for the standard method.

Continuing the previous field example, in the standard method, the flight crew executes a "paddle" calibration on their imaging system at 60 C with an integration time of 5 ms. As the temperature is dropped at 5 C steps down to 10 C, the temporal noise is fairly constant, but the fixed pattern noise climbs significantly, resulting in poor low temperature performance.

Using dynamic MIB calibration method 500, with target bucket fill 36 of 60%, the flight crew does not need to execute any "paddle" calibrations. Imaging system 10 automatically adjusts the integration time and uses coefficient factors which are matched to the scene temperature and integration time. At all temperature levels, there is reduced temporal noise due to the longer integration time that the system settles on. There is also low and relatively flat fixed pattern noise due to the NUC correction being optimized for the current scene temperature. Overall NETD is reduced by greater than a factor of 5 at the lowest temperature.

A parallel and similar method is to select a target integration time for imaging system 10 rather than a bucket fill level. Then a set of correction tables 30 are developed based on a target integration time. Correction table 30 is then selected in operation by the current bucket fill level and the scene temperature.

FIG. 6 is an example of an acquired image 600 as may be captured at focal array 12 by image system 10. Image 600 in this example includes cars 602, trees 604 and pedestrians or people 606 as seen from above. Image 600 may be shown on display 28 and may correlate or correspond to pixel values at focal plane array 12. The pixel values may be stored in memory 22. One person of people 606 in image 600 is denoted by a dotted line. The subset of pixels that comprise the portion of image 600 within the dotted line may comprise a feature sub-region 608 of image 600. One or more pixels comprising feature sub-region 608 may be selected and used to determine a bucket fill value for image 600. Feature sub-region 608 may be used to determine a bucket fill value to optimize imaging system 10 for depicting the feature in later images.

Where multiple images are acquired and used to calculate a single bucket fill value, a feature sub-region 608 may be defined for each image 600. The one or more pixels comprising each feature sub-region 608 may differ in successive images as the position of the feature of interest occupies different xy coordinates in successive images.

The example shown of a person as subject of a feature sub-region is an example. Any feature sub-region, subset of pixels or all of the pixels may be used in determining a bucket fill value for an image. The subset of pixels selected may define a feature sub-region or may not.

This invention is not limited by a method of implementation. Calibration methods may be applied at the pixel. The methods may be implemented using a custom integrated circuit or programmable IC. The methods may be implemented through software algorithms that set camera parameters for image acquisition and/or manipulate image pixel values stored in memory. The calibration methods may use a hybrid of implementation methods.

These configurations and methods shown are examples for the purpose of illustration and are not to be used as limitations. Any combination of steps or components which perform a similar function falls within the scope of this disclosure. Any suitable configuration or combination of components presented, or equivalents to them that perform a similar function, may also be used. And while infrared imaging systems have been discussed and used in the examples, this method and system is applicable to any image analysis for any wavelength.

While embodiments of an image analysis system and methods of use have been particularly shown and described, many variations may be made therein. This disclosure may include one or more independent or interdependent inventions directed to various combinations of features, functions, elements and/or properties, one or more of which may be defined in the following claims. Other combinations and sub-combinations of features, functions, elements and/or properties may be claimed later in this or a related application. Such variations, whether they are directed to different combinations or directed to the same combinations, whether different, broader, narrower or equal in scope, are also regarded as included within the subject matter of the present disclosure. An appreciation of the availability or significance of claims not presently claimed may not be presently realized. Accordingly, the foregoing embodiments are illustrative, and no single feature or element, or combination thereof, is essential to all possible combinations that may be claimed in this or a later application. Each claim defines an invention disclosed in the foregoing disclosure, but any one claim does not necessarily encompass all features or combinations that maybe claimed. Where the claims recite "a" or "a first" element or the equivalent thereof, such claims include one or more such elements, neither requiring nor excluding two or more such elements. Further, ordinal indicators, such as first, second or third, for identified elements are used to distinguish between the elements, and do not indicate a required or limited number of such elements, and do not indicate a particular position or order of such elements unless otherwise specifically stated.

The invention claimed is:

1. A method for operating an infrared imaging system with an array of pixels comprising:
   developing correction tables for the array of pixels including:
      correction factors with offset and gain values for each pixel; and
      an index of unique values for each correction table with:
         an integration time value;
         a bucket fill value where the bucket fill value of the index is substantially limited to a target bucket fill level; and
         a temperature value;
   acquiring at least one calibrating scene image with a selected integration time;
   determining bucket fill level of the at least one calibrating scene image;
   determining a scene temperature of the at least one calibrating scene image;
   selecting a correction table by indexing the selected integration time, determined temperature and determined bucket fill level to correction table index values;
   applying the correction factors of the selected correction table to the array of pixels; and
   capturing a second image including operating the imaging system to maintain the target bucket fill level.

2. The method for operating an infrared imaging system of claim 1 where developing a correction table includes defining values for bucket fill levels, temperature and integration time to be incorporated in indexes.

3. The method for operating an infrared imaging system of claim 2 where developing a correction table includes configuring the imaging system to each unique set of index values and capturing an image.

4. The method for operating an infrared imaging system of claim 1 where capturing a second image includes applying a histogram equalization algorithm to the captured image.

5. A method for minimizing a noise equivalent temperature difference value of a focal plane array with pixels in an infrared imaging system comprising:
   defining a group of bucket fill levels;
   defining a group of integration times;
   defining a group of temperatures;
   creating pixel data by
      creating an index by selecting one value for each of bucket fill level, integration time and temperature from each defined group;
      setting a substantially blackbody to the selected temperature value of the index;
      setting the integration time of the imaging system to the selected integration time value of the index;
      setting the bucket fill level of the imaging system to the selected bucket fill level value of the index;
      with the blackbody image focused on the focal plane array, capturing one or more data images; and
      saving to memory the pixel data of the data image indexed to the selected index values;
   repeating the creating step for each unique set of index values;
   for each pixel calculating correction factors by solving:
      a first linear equation of pixel data of a first index; and
      a second linear equation of pixel data of a second index;
   storing the calculated correction factor in memory with the first index as a correction factor index;
   acquiring an image of a scene at a selected integration time;
   determining scene temperature;
   calculating a bucket fill level from one or more pixels selected from the acquired image;
   selecting correction factors from memory by correlating correction factor index values to calculated bucket fill level, integration time and scene temperature; and
   applying the selected correction factors to pixels of the focal plane array.

6. The method for minimizing the noise equivalent temperature difference of a focal plane array of claim 5 where the group of bucket fill levels has one value.

7. The method for minimizing the noise equivalent temperature difference of a focal plane array of claim 5 where the infrared imaging system is configured to acquire images at one target bucket fill value.

8. The method for minimizing the noise equivalent temperature difference of a focal plane array of claim 7 where configuring the imaging system to operate at one bucket fill value includes iteratively acquiring a scene image, calculating the bucket fill level of the acquired scene image, resetting integration time and acquiring a scene image.

9. The method for minimizing the noise equivalent temperature difference of a focal plane array of claim 5 where a histogram equalization algorithm is applied to the acquired image.

10. The method for minimizing the noise equivalent temperature difference of a focal plane array of claim 5 where the one or more pixels selected from the acquired image are selected from a feature sub-region of the acquired image.

11. A method for operating an infrared imaging system with an array of pixels comprising:
   developing correction tables for the array of pixels including:
      correction factors with offset and gain values for each pixel; and
      an index of unique values for each correction table with:
         an integration time value;
         a bucket fill value; and
         a temperature value;
   acquiring at least one calibrating scene image with a selected integration time;
   determining bucket fill level of the at least one calibrating scene;
   determining a scene temperature of the at least one calibrating scene image;
   selecting a correction table by indexing the selected integration time, determined temperature and determined bucket fill level to correction table index values;
   applying the correction factors of the selected correction table to the array of pixels; and
   capturing a second image including operating the imaging system to maintain the target bucket fill level, where operating the imaging system to maintain a target bucket fill level includes iteratively:
   capturing one or more images;
   calculating the bucket fill for each of the one or more images;
   determining the difference between the target bucket fill level and the calculated bucket fill; and selecting an integration time based on the calculated bucket fill.

12. The method for operating an infrared imaging system of claim 11 where developing a correction table includes defining values for bucket fill levels, temperature and integration time to be incorporated in indexes.

13. The method for operating an infrared imaging system of claim 12 where developing a correction table includes configuring the imaging system to each unique set of index values and capturing an image.

14. The method for operating an infrared imaging system of claim 11 where capturing a second image includes applying a histogram equalization algorithm to the captured image.

* * * * *